(12) United States Patent
Tamemoto et al.

(10) Patent No.: US 10,084,108 B2
(45) Date of Patent: Sep. 25, 2018

(54) METHOD FOR MANUFACTURING LIGHT EMITTING ELEMENT

(71) Applicant: NICHIA CORPORATION, Anan-shi, Tokushima (JP)

(72) Inventors: Hiroaki Tamemoto, Anan (JP); Chihiro Juasa, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/471,244

(22) Filed: Mar. 28, 2017

(65) Prior Publication Data
US 2017/0200855 A1    Jul. 13, 2017

Related U.S. Application Data

(62) Division of application No. 14/466,354, filed on Aug. 22, 2014, now Pat. No. 9,640,714.

(30) Foreign Application Priority Data

Aug. 29, 2013   (JP) .................................. 2013-177789

(51) Int. Cl.
| H01L 21/78 | (2006.01) |
| H01L 33/00 | (2010.01) |
| H01L 33/22 | (2010.01) |
| H01L 33/32 | (2010.01) |
| H01L 33/20 | (2010.01) |

(52) U.S. Cl.
CPC ........ *H01L 33/007* (2013.01); *H01L 33/0095* (2013.01); *H01L 33/22* (2013.01); *H01L 33/32* (2013.01); *H01L 33/20* (2013.01)

(58) Field of Classification Search
USPC .................................. 438/33, 113, 114, 459
See application file for complete search history.

(56) References Cited

U.S. PATENT DOCUMENTS

| 2005/0202596 A1 | 9/2005 | Fukuyo et al. |
| 2006/0011593 A1 | 1/2006 | Fukuyo et al. |
| 2006/0148212 A1 | 7/2006 | Fukuyo et al. |
| 2007/0158314 A1 | 7/2007 | Fukumitsu et al. |
| 2008/0303042 A1 | 12/2008 | Minato et al. |
| 2009/0101936 A1 | 4/2009 | Kamei et al. |
| 2010/0015783 A1 | 1/2010 | Fukuyo et al. |
| 2010/0187542 A1 | 7/2010 | Ichihara et al. |

(Continued)

FOREIGN PATENT DOCUMENTS

| JP | 2003-338636 A | 11/2003 |
| JP | 2007-294804 A | 11/2007 |

(Continued)

*Primary Examiner* — Kimberly Rizkallah
*Assistant Examiner* — Bo Bin Jang

(57) ABSTRACT

A method for manufacturing a light emitting element that includes preparing a wafer having a substrate and a semiconductor structure, the substrate including a plurality of protrusions at positions corresponding to lattice points on a regular triangular lattice. The method includes forming a plurality of first modified parts in the substrate by irradiating the substrate with a laser beam along first dividing lines, forming a plurality of second modified parts in the substrate by irradiating the substrate with a laser beam along second dividing lines, and dividing the wafer along the first modified parts and the second modified parts to obtain a plurality of light emitting elements.

15 Claims, 5 Drawing Sheets

(56) References Cited

U.S. PATENT DOCUMENTS

| | | |
|---|---|---|
| 2010/0187565 A1 | 7/2010 | Kamei et al. |
| 2010/0237382 A1 | 9/2010 | Kamei |
| 2010/0255621 A1 | 10/2010 | Minato et al. |
| 2011/0306182 A1 | 12/2011 | Fukuyo et al. |
| 2012/0205358 A1 | 8/2012 | Fukuyo et al. |
| 2012/0329248 A1 | 12/2012 | Fukuyo et al. |
| 2013/0037825 A1 | 2/2013 | Hiraiwa et al. |
| 2013/0146892 A1 | 6/2013 | Minato et al. |
| 2013/0252402 A1 | 9/2013 | Fukuyo et al. |
| 2013/0252403 A1 | 9/2013 | Fukuyo et al. |
| 2013/0344686 A1 | 12/2013 | Fukuyo et al. |
| 2014/0080288 A1 | 3/2014 | Fukuyo et al. |
| 2014/0124805 A1 | 5/2014 | Minato et al. |

FOREIGN PATENT DOCUMENTS

| | | |
|---|---|---|
| JP | 2008-177528 A | 7/2008 |
| JP | 2009-184860 A | 8/2009 |
| JP | 2011-243730 A | 12/2011 |
| JP | 2012-160502 A | 8/2012 |
| JP | 2013-051298 A | 3/2013 |
| WO | 2009-020033 A1 | 2/2009 |
| WO | 2009-054088 A1 | 4/2009 |
| WO | 2011-145370 A1 | 11/2011 |

METHOD FOR MANUFACTURING LIGHT EMITTING ELEMENT

CROSS-REFERENCE TO RELATED APPLICATIONS

This application is a divisional application of U.S. patent application Ser. No. 14/466,354, filed on Aug. 22, 2014. This application claims priority to Japanese Patent Application No. 2013-177789 filed on 29 Aug. 2013. The entire disclosures of U.S. patent application Ser. No. 14/466,354 and Japanese Patent Application No. 2013-177789 are hereby incorporated herein by reference.

BACKGROUND

Technical Field

The present disclosure relates to a method for manufacturing a light emitting element.

Related Art

As applications for LED (light emitting diode) elements have expanded in recent years, this has been accompanied by a need for higher brightness. Therefore, it has been proposed that a sapphire surface that is in contact with a semiconductor layer is provided with a texturing, i.e., protrusion, that allows the light propagating horizontally through the semiconductor layer to be extracted outside of the element (see JP2008-177528A and JP2012-160502A).

SUMMARY

LED elements such as this need to be offered not only with higher brightness, but also at a lower price, and there is a need for a further increase in the number of elements that can be obtained from a single wafer.

The embodiments of the present invention relates to a method for manufacturing a light emitting element. The method for manufacturing a light emitting element includes preparing a wafer, the wafer including a substrate and a semiconductor structure. the substrate including a main face and a plurality of protrusions. The protrusions are disposed at positions corresponding to lattice points of a regular triangular lattice, the regular triangular lattice including a plurality of lattice lines. The semiconductor structure is provided on the main face of the substrate.

The method also includes forming a plurality of first modified parts in the substrate by irradiating the substrate with a laser beam along first dividing lines. The first dividing lines are disposed parallel to each other, at a first spacing to each other, and intersecting with the lattice lines of the regular triangular lattice at a first acute angle. The first acute angle is the smallest angle formed by the lattice lines and the first dividing lines.

The method further includes forming a plurality of second modified parts in the substrate by irradiating the substrate with a laser beam along second dividing lines. The second dividing lines are disposed perpendicular to the first dividing lines, parallel to each other, at a second spacing that is less than the first spacing, and intersecting with the lattice lines of the regular triangular lattice at a second acute angle. The second acute angle is the smallest of the angles formed by the lattice lines and the second dividing lines, and the second acute angle is more acute than the first acute angle.

Moreover, the method includes dividing the wafer along the first modified parts and the second modified parts to obtain a plurality of light emitting elements.

With the method for manufacturing the light emitting element according to embodiments of this invention, since division can be performed linearly along the second dividing lines, the yield of elements per wafer is higher and the manufacturing cost is lower.

DETAILED DESCRIPTION

Figure 1:
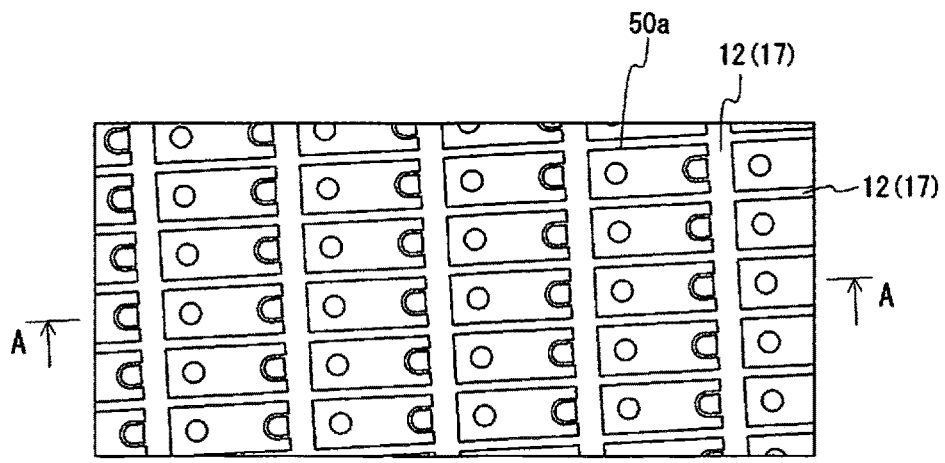
FIG. 1 is a schematic plan view illustrating a step in an embodiment of the present invention.

Embodiments for implementing the method for manufacturing a light emitting element according to the present invention will be described below with reference to the accompanying drawings. In the following embodiments that embody the technological concept of the present invention are just examples, and unless otherwise specified, the constituent parts discussed in the embodiments are not intended to limit the scope of the present invention.

Further, in the description below, the same designations or the same reference numerals may, in principle, denote the same or like members and duplicative descriptions will be appropriately omitted.

(Wafer Preparation Step)

Figure 2:
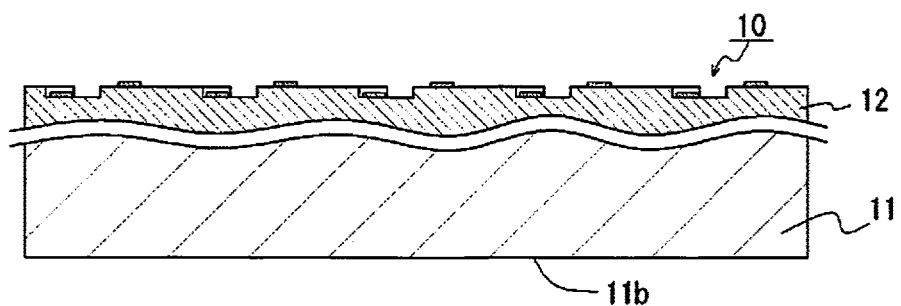
FIG. 2 is a cross section along the A-A line in FIG. 1.
Figure 3:
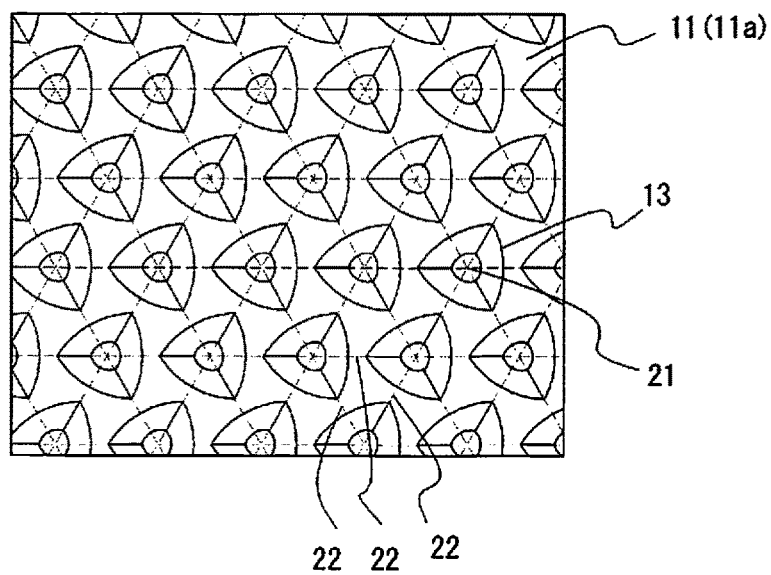
FIG. 3 is a plan view of an example of the layout of protrusions.

First, as shown in FIGS. 1 and 2, a wafer 10 is prepared that has a substrate 11 and a semiconductor structure 12 provided on one main face side of the substrate 11. FIG. 1 is a schematic plan view illustrating the steps in this embodiment, and is a detail view of part of the wafer 10. FIG. 2 is a cross section along the A-A line in FIG. 1. The hatched portion in FIG. 2 is the cutting plane, and the other portion is how the wafer looks when viewed in the direction in which the cutting plane is drawn. As shown in FIG. 3, protrusions 13 are provided on a first main face 11a (one main face) of the substrate 11 at positions corresponding to lattice points 21 of a triangular lattice. FIG. 3 is a plan view of an example of the layout of the protrusions, and is a detail view of part of the substrate 11. As shown in FIG. 3, the triangular lattice is such that a plurality of triangles are laid out two-dimensionally, and the protrusions 13 are provided at positions corresponding to the lattice points 21. Lattice lines 22 of the triangular lattice are lines that connect adjacent lattice points 21, and these lines constitute the sides of the smallest triangles of the triangular lattice. In FIG. 3, a plurality of the lattice lines 22 are arranged on a single straight line, forming one straight line.

(First Modified Part Formation Step)

Figure 4:
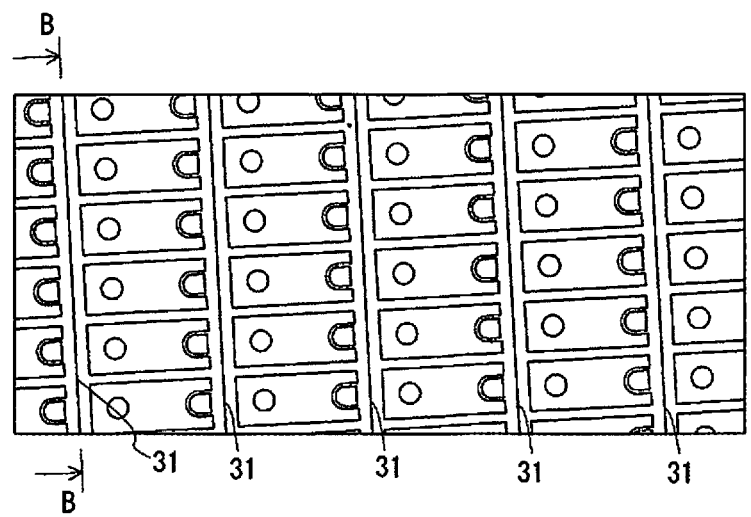
FIG. 4 is a schematic plan view illustrating a step in an embodiment of the present invention.
Figure 5:
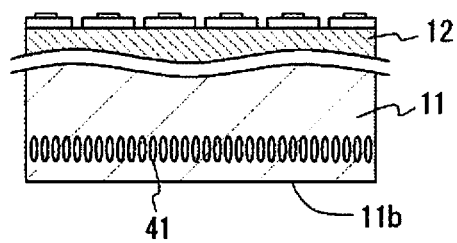
FIG. 5 is a cross section along the B-B line in FIG. 4.
Figure 6:
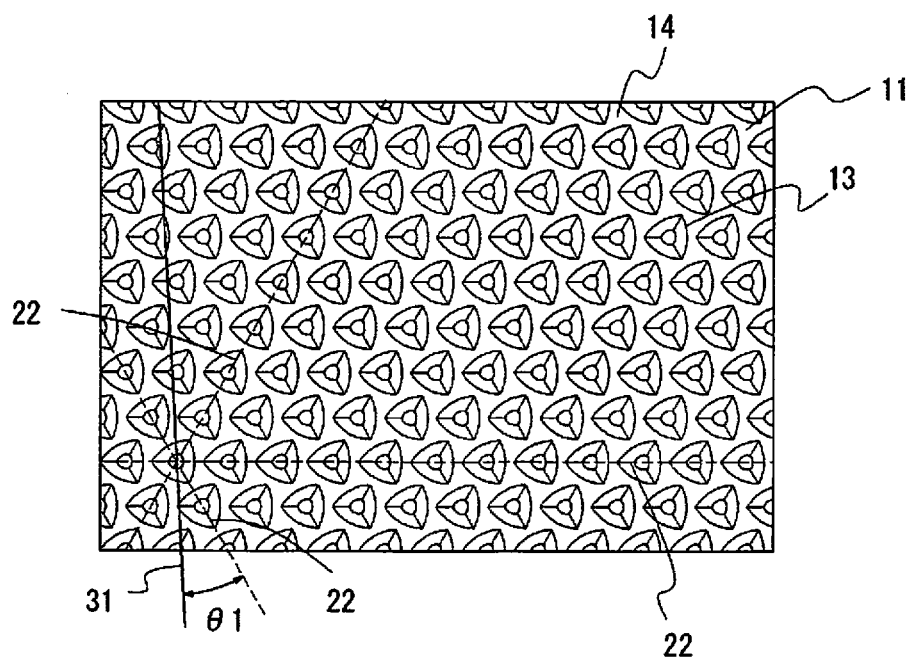
FIG. 6 is a plan view of the relation between the protrusions and the first dividing lines.

As shown in FIGS. 4 and 5, a plurality of first modified parts 41 are formed in the substrate 11 by irradiating a laser beam along first dividing lines 31. FIG. 4 is a schematic plan view illustrating the steps in this embodiment, and FIG. 5 is a cross section along the B-B line in FIG. 4. The hatched portion in FIG. 5 is the cutting plane, and the other portion is how the wafer looks when viewed in the direction in which the cutting plane is drawn. As shown in FIG. 4, the first dividing lines 31 are lines arranged in parallel and at a constant spacing (first spacing), and are not parallel to any of the lattice lines 22. Also, as shown in FIG. 6, the first dividing lines 31 are imaginary lines in which a first angle $\theta 1$, which is the smallest of the angles formed by the lattice lines 22 of the triangular lattice and the first dividing lines 31, is greater than zero. FIG. 6 is a plan view of the relation between the protrusions 13 and the first dividing lines 31, and is a detail view of part of the substrate 11. The first dividing lines 31 are set so that the relation between the first angle $\theta 1$ and a second angle $\theta 2$ (discussed below) will be $0 < \theta 2 < \theta 1$. That is, in the case where the triangular lattice is in the form of a regular triangle as shown in FIG. 6, for example, then $\theta 1$ will be less than 30°.

(Second Modified Part Formation Step)

Figure 7:
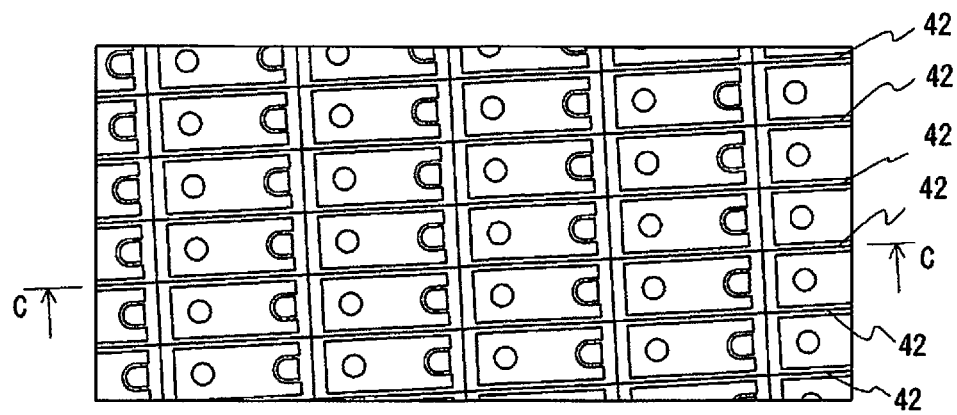
FIG. 7 is a simplified plan view illustrating a step in an embodiment of the present invention.
Figure 8:
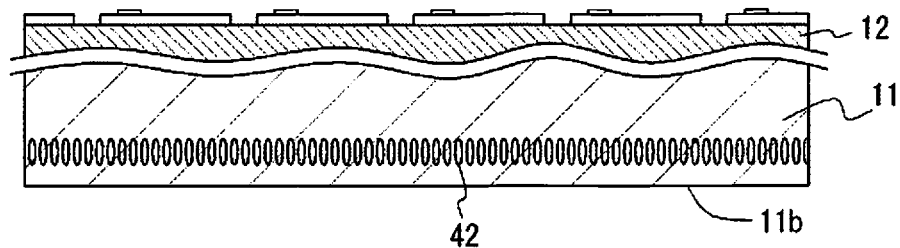
FIG. 8 is a cross section along the C-C line in FIG. 7.
Figure 9:
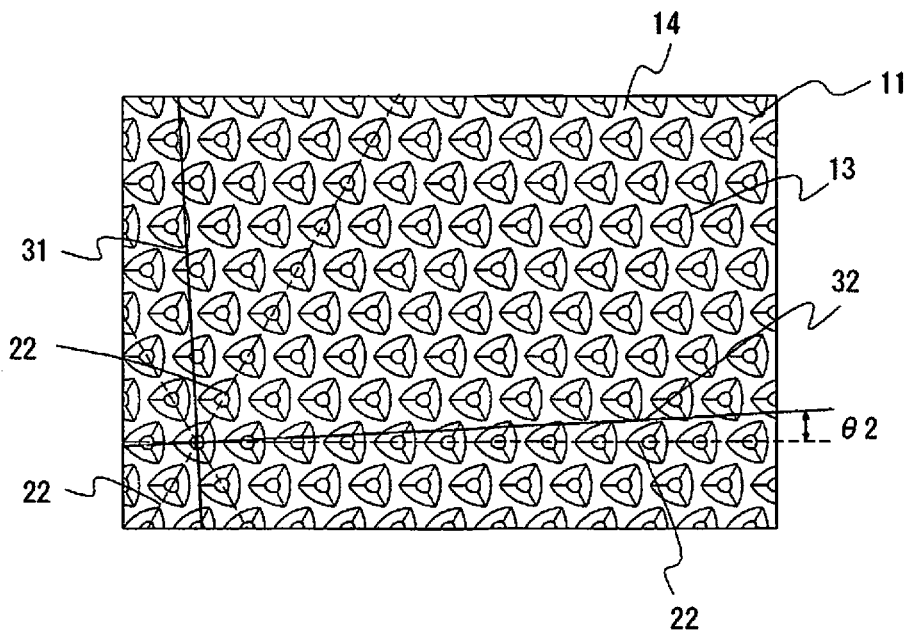
FIG. 9 is a plan view of the relation between the protrusions and the second dividing lines.

As shown in FIGS. 7 and 8, a plurality of second modified parts 42 are formed in the substrate by irradiating a laser beam along second dividing lines 32. FIG. 7 is a schematic plan view illustrating the steps in this embodiment of the present invention, and FIG. 8 is a cross section along the C-C line in FIG. 7. In FIG. 8, the hatched portion is the cutting plane, and the other portion is how the wafer looks when viewed in the direction in which the cutting plane is drawn. As shown in FIG. 7, the second dividing lines 32 are perpendicular to the first dividing lines 31 and are arranged in parallel and at a second spacing that is smaller than the first spacing. Also, the second dividing lines 32 are not parallel to any of the lattice lines 22. Furthermore, as shown in FIG. 9, the second dividing lines 32 are imaginary lines in which a second angle $\theta 2$, which is the smallest of the angles formed by the lattice lines 22 of the triangular lattice and the second dividing lines 32, is greater than zero and less than the first angle $\theta 1$. FIG. 9 is a plan view of the relation between the protrusions 13 and the second dividing lines 32. The second modified parts may be formed after the first modified parts, or in reverse order.

The laser beam irradiation conditions can be similar in the formation of both the first modified parts 41 and the second modified parts 42. The laser beam that forms the first modified parts 41 and the second modified parts 42 preferably has a pulse width of at least 100 femtoseconds and not more than 500 nanoseconds, with 10 picoseconds or less being even better. In the case where the modified parts are formed by multi-photon absorption, cracks will readily spread out from the processed parts produced at the focal position of the laser beam, and this makes it easy to divide the wafer precisely. Also, in the case where the processed parts are produced by multi-photon absorption, the substrate 11 will not be discolored, which prevents a decrease in light output that would be caused by light absorption at the modified parts. The pulse energy of the laser beam can be about 0.5 to 10 µJ.

To suppress damage to the semiconductor structure 12 by irradiation with the laser beam, it is preferable that the laser beam is directed from a second main face 11b side, which is the side opposite to where the semiconductor structure 12 is provided, rather than the first main face 11a. Since the protrusions 13 are formed on the first main face 11a side, it is preferable to irradiate with the laser beam from the second main face 11b side in order to prevent a decrease in processing efficiency and damage to the semiconductor structure 12 due to the scattering of the laser beam by the protrusions 13. The focal position of the laser beam is preferably more toward to the inside of the substrate 11 than the second main face 11b, and is preferably set to a position that is closer to the second main face 11b than the first main face 11a. For example, it is set to adjust the focal point to a spot diameter of 10 µm or less at a position that is about 5 to 50 µm to the inside of the second main face 11b. The laser beam can be scanned so that its focal position will overlap each of the first dividing lines 31 and the second dividing lines 32 in plan view. The same dividing line can be scanned a plurality of times at different focal depths, but in this case the focal position may vary from one scan to the next, causing the point of origin of the division to vary from one scan to the next, so that dividing line tends to undulate. Thus, it is preferable for the laser beam irradiation conditions to be such that cracks will be generated so as to allow division after a single scan.

(Wafer Division Step)

Figure 10:
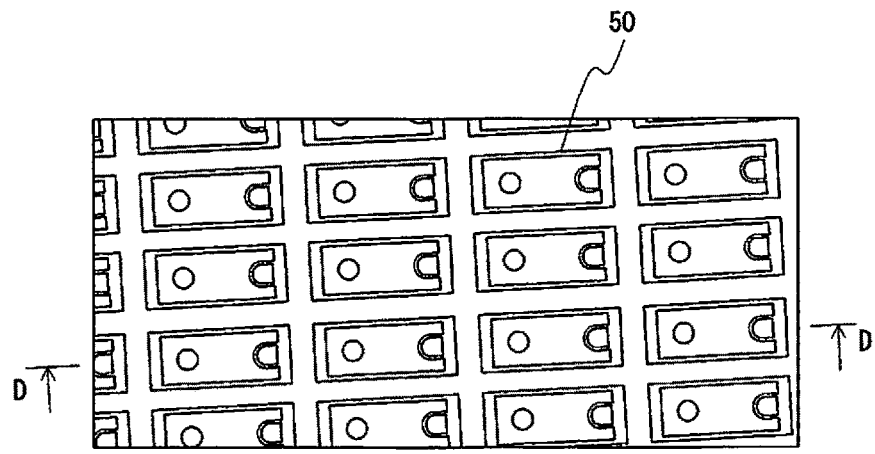
FIG. 10 is a schematic plan view illustrating a step in an embodiment of the present invention.
Figure 11:
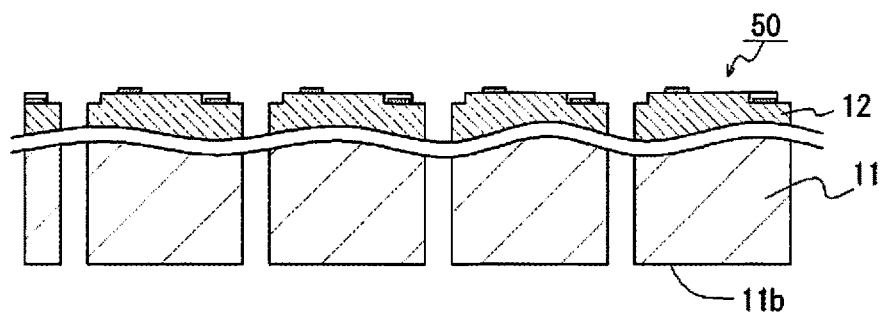
FIG. 11 is a cross section along the D-D line in FIG. 10.

As shown in FIGS. 10 and 11, a plurality of light emitting elements 50 are obtained by dividing the wafer 10 along the first modified parts 41 and the second modified parts 42. FIG. 10 is a schematic plan view illustrating the steps in this embodiment, and FIG. 11 is a cross section along the D-D line in FIG. 10. The hatched portion in FIG. 11 is the cutting plane, and the other portion is how the wafer looks when viewed in the direction in which the cutting plane is drawn. The division of the wafer 10 can be accomplished, for example, by breaking. Depending on the thickness of the substrate 11 and the laser beam irradiation conditions, the substrate 11 can be completely divided in the formation of the first modified parts 41 and/or the second modified parts 42. The step of forming the first modified parts 41 (or the second modified parts 42) thus can also serve as a step of dividing the wafer. The plan view shape of the light emitting elements 50 obtained in the above process is rectangular.

The method for manufacturing a light emitting element in this embodiment can allow the cost to be lowered. This point will be described below in detail.

First, as shown in FIGS. 6 and 9, on the first main face 11a of the substrate 11, the areas between the protrusions 13 are connected by valleys 14, which are portions that are relatively recessed, and because these valleys 14 are thinner, they are not as strong as the protrusions 13. When an external force is applied to divide a substrate 11 such as this, because the division is actually breaking, the division (breaking) proceeds toward the valleys 14 that are lower in strength. The semiconductor structure 12 is similarly divided in the course of dividing the substrate 11.

If the angle formed by the dividing lines and the lattice lines 22 of the lattice where the protrusions 13 are disposed is zero, that is, if the lattice lines 22 and the dividing lines are parallel, then of the plurality of dividing lines disposed within a single wafer 10, some will be lines that mainly pass through the valleys 14, and others will be lines that mainly pass through the protrusions 13, so the ease of division will vary from one line to another. It is extremely difficult to match the positions of all of the dividing lines to the layout of the protrusions 13, so this variance in ease of division is difficult to avoid. Therefore, while the division will be linear with lines that pass only through the valleys 14, the division will undulate with lines that mainly pass through the protrusions 13, for the breakage tends to proceed forcibly toward the weaker valley 14 side. Thus, there will be a difference in the division state depending on the line. In this case, as the ease of division will vary from one line to another, the optimal values for the division conditions, such as the output of the scribing laser beam, will vary from one line to another. Therefore, if the division conditions of the scribing laser beam are set so that the division conditions are optimal with respect to lines where division is easy, defective division may occur at lines where division is not easy, but if the division conditions are set so that it is optimal with respect to lines where division is not easy, the damage may occur at lines where division is easy.

Figure 12:
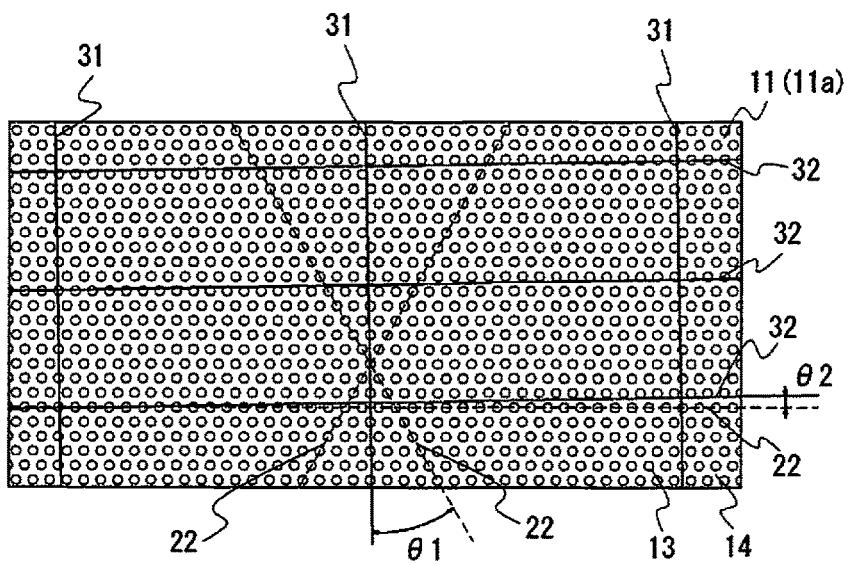
FIG. 12 is a schematic view of the relation between the first dividing lines and second dividing lines, and the layout of protrusions.

In view of this, in this embodiment, variance in the ease of division is improved by having the dividing lines 31 and 32 intersect the lattice lines 22 where the protrusions 13 are disposed. An example is shown in FIG. 12. FIG. 12 is a schematic view of the relation between the first dividing lines 31 and the second dividing lines 32, and the layout of the protrusions 13. Between FIG. 12 and FIGS. 1 to 11, there are portions that differ in the details, such as the shape of the protrusions 13, but members that are numbered the same refers substantially the same member. Thus having the dividing lines 31 and 32 intersect the lattice lines 22 causes the distance through the valleys 14 to vary periodically in the similar way for all of the dividing lines 31 or the dividing lines 32 within the wafer 10. This improves the variance in ease of division among the dividing lines 31 or among the dividing lines 32.

In addition, it is believed that, since linear divisions are made at portions where division is easy, the portions where division is not easy also tend to be divided linearly due to the effect of this linearity, and in particular all of the second dividing lines 32 will tend to be divided linearly. In this embodiment, as shown in FIG. 12, etc., the minimum intersection angle θ2 between the second dividing lines 32 and the lattice lines 22 is set to be smaller than the minimum intersection angle θ1 between the first dividing lines 31 and the lattice lines 22. Consequently, it is believed that, since the length of the portions where division is easy is greater in the second dividing lines 32 than in the first dividing lines 31, that is, the portions that are divided linearly are longer, substantially all of the second dividing lines 32 are divided linearly due to the effect of this linearity.

The light emitting elements 50 that are obtained by dividing along the first dividing lines 31 and the second dividing lines 32 here are rectangular in shape, with the side divided at the first dividing lines 31 being the short side, and the side divided at the second dividing lines 32 being the long side. Since these second dividing lines 32 are spaced more tightly than the first dividing lines 31, their total length with the wafer 10 is also greater than that of the first dividing lines 31. Thus, suppressing undulation of the dividing lines on the long side allows the cutting allowance (street width) to be reduced in dividing the long side without lowering the yield, and this can increase the number of light emitting elements that can be obtained from a single wafer 10, and can keep the cost lower. Also, suppressing undulation of the dividing lines by linearly dividing at the second dividing lines 32 can reduce the likelihood that the cutting will encroach on the light emitting parts 50a of the light emitting elements 50 on the long side, so the incidence of cutting encroachment can be reduced.

Also, on the short side, compared to conditions under which undulation is most likely to occur when the dividing lines are disposed parallel to the lattice lines 22 (when the dividing lines are lines mainly passing through the protrusions 13), it is believed that undulation of the dividing lines will be less likely to occur.

Also, since the ease of division is similar for all of the first dividing lines 31, the similar division state can be obtained under a given set of division conditions. The same applies to the second dividing lines 32.

The members used in the method for manufacturing a light emitting element in this embodiment will now be described in detail.

(Substrate 11)

Any growth substrate on which the semiconductor structure 12 can be grown can be used as the substrate 11. If the semiconductor structure 12 is a nitride semiconductor, the material of the substrate 11 is preferably one with a hexagonal crystal structure, a typical example of which is sapphire. Since a sapphire substrate has poor cleavage and its dividing lines are prone to undulation, the effect of suppressing undulation of the dividing lines provided by the manufacturing method in this embodiment will be particularly obtained in the case where a sapphire is used. For example, a sapphire substrate whose main face is the C plane can be used. In this case, the main face prior to the formation of the protrusions 13 is the C plane, and after the formation of the protrusions 13 the C plane appears on the bottom of the valleys 14, the top of the protrusions 13, or some other flat face.

When the substrate 11 is a sapphire substrate whose main face is the C plane, it is preferable that the protrusions 13 are disposed so that the first dividing lines 31 and the second dividing lines 32 both intersect both the A plane and the M plane of the sapphire substrate. As the division avoids the A plane and the M plane, there will be less inclination of the division faces of the substrate 11, and the angle of the side face of the substrate 11 to the main face will be closer to perpendicular, so the street width can be further reduced. In this case, the intersection angle with the A plane or M plane of the second dividing lines 32 is preferably at least 1° and not more than 15°, with a range of 3 to 10° being even better.

The main face of the substrate 11 can have an off angle. This off angle is about 0 to ±10°, for example, preferably about 0 to ±5°, about 0 to ±2°, about 0 to ±1°, about 0 to ±0.5°, about 0 to ±0.25°. There are no particular limitations on the thickness of the substrate 11, but from the standpoint of reliably dividing without excessive breakage caused by irradiation with the laser beam, a range of about 40 to 200 μm is preferable. The thickness range can be such that the substrate 11 is made thinner by polishing or the like after the formation of the semiconductor structure 12.

(Semiconductor Structure 12)

Figure 13:
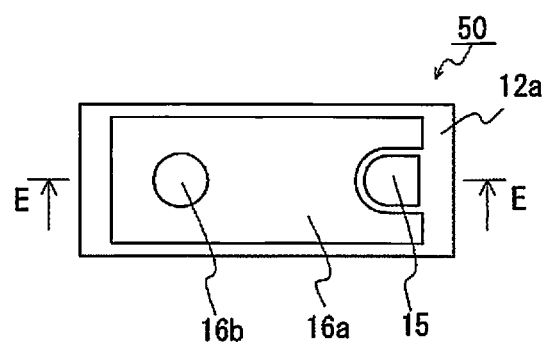
FIG. 13 is a schematic plan view of the light emitting element in an embodiment of the present invention.
Figure 14:
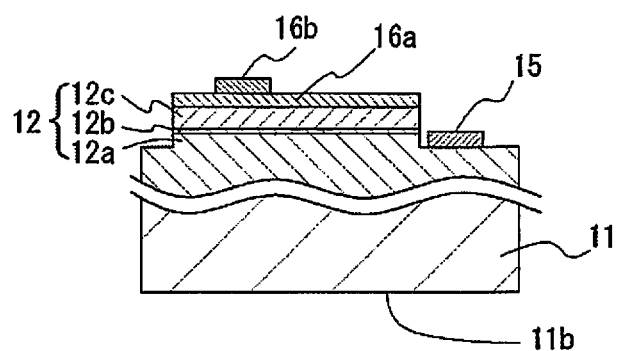
FIG. 14 is a cross section along the E-E line in FIG. 13.

The semiconductor structure 12 is made of a nitride semiconductor, for example. More specifically, it can be the product of laminating a plurality of semiconductor layers made of $In_XAl_YGa_{1-X-Y}N$ (0≤X, 0≤Y, X+Y≤1) on the substrate 11 using with a method such as a metalorganic chemical vapor deposition (MOCVD) method. As shown in FIGS. 13 and 14, the semiconductor structure 12 has a first conductivity type semiconductor layer 12a (such as an n-type semiconductor layer), a light emitting layer 12b, and a second conductivity type semiconductor layer 12c (such as a p-type semiconductor layer) in that order starting from the substrate 11. FIG. 13 is a schematic plan view of a light emitting element 50 in this embodiment, and FIG. 14 is a cross sectional view (end view) along the E-E line in FIG. 13.

In the case where the substrate 11 has insulation properties, the second conductivity type semiconductor layer 12c and the light emitting layer 12b are removed partially to expose the first conductivity type semiconductor layer 12a, thereby forming a first electrode 15 and second electrodes 16a and 16b on the first conductivity type semiconductor layer 12a and the second conductivity type semiconductor layer 12c, respectively. The first electrode 15 and second electrodes 16a and 16b can be formed of a or a laminate film of transparent conductive oxides such as ITO, or metals such as W, Al, Ti, Cr, Rh, Pt, Au, Ni, etc. or alloys thereof in a single-layer structure or multilayer structure. A protective film such as an $SiO_2$ film can be provided to cover the surface of the semiconductor structure 12 and these electrodes 15, 16a, and 16b.

The thickness of the semiconductor structure 12 is usually less than that of the substrate 11, and is about a few microns.

As shown in FIG. 1, streets 17 are usually the regions other than the light emitting parts 50a, that is, regions where the light emitting layer 12b is not present. For example, streets 17 can be a region where the first conductivity type semiconductor layer 12a is exposed, or a region where the substrate 11 is exposed. The street width here is defined as the distance between adjacent light emitting components 50a in the regions that become the light emitting elements 50 after they have been individually cut out. In the case where no light emitting layer removal portion is provided, the street width can be defined by the distance between electrodes in adjacent light emitting element regions. The street width is preferably set as narrow as possible since it is a region that does not contribute to light emission. The street width can be set to between 10 and 50 μm, with 15 to 30 μm being more preferable. The street width through which the second dividing lines 32 pass can also be set lower than the street width through which the first dividing lines 31 pass.

(Protrusions 13)

The protrusions 13 are provided to the surface of the substrate 11. Part of the light propagating through the semiconductor structure 12 is reflected by the surfaces of these protrusions 13, which changes the propagation direction, and this increases the light extraction efficiency. The protrusions 13 can be formed by removing part of the surface of the substrate 11. More specifically, an example is a method in which the surface of the substrate 11 except the portion that will become the protrusions is removed by dry etching, wet etching, or other such etching using a mask pattern of a suitable shape.

As shown in FIG. 3, the triangular lattice in which the protrusions 13 are laid out is disposed two-dimensionally in a plan view of the first main face 11a of the substrate 11. The protrusions 13 can be disposed so that their centers substantially coincide with the lattice points 21. It is preferable that the triangular lattice is a regular triangular lattice consisted of regular triangles. The protrusions 13 arranged in such a way can further improve light extraction efficiency. It is preferable that the valleys 14 that link the protrusions 13 are flat faces.

The shape of the protrusions 13 can be controlled, for example, by suitably adjusting the shape of the mask pattern being used, and the etching method and conditions. Examples of the shape of the mask pattern include a pattern of repeating circles, ellipses, or polygonal shapes, such as quadrangles or triangles. For example, if a mask with a polygonal shape is used in wet etching, the shape of the protrusions 13 will be such that the portions corresponding to the sides of the polygonal shapes are curved outward, making it easier to form a semi-polygonal (polygonal-approximated) shape.

The plan view shape of the protrusions 13 is preferably polygonal, or a semi-polygonal shape in which the sides of the polygons are replaced by curved lines. The plan view shape of the protrusions 13 shown in FIG. 3 is a semi-regular-triangular shape in which the sides of regular triangles have been replaced by curved lines. For example, when the plan view shape of the protrusions 13 is circular or a triangular shape that is inscribed in this circle, a comparison of the distance by which the first dividing line 31 or the second dividing line 32 passes near the end of the protrusion 13 reveals that the passage distance of the protrusion 13 is shorter when the line passes near the apex of triangle than when that passes near the end of circle, and it is believed that this will result in less undulation during division when the plan view shape of the protrusions 13 is triangular shape. In the case where the protrusions 13 are triangular or semi-triangular, it is easier to lay them out at high density in the triangular lattice, so this is also preferable in terms of increasing the light extraction efficiency. In the case where the protrusions 13 are polygonal, all of the protrusions 13 can be disposed in the same orientation. For instance, in the case where the protrusions 13 are triangular or semi-triangular, they can be laid out more densely when their apexes are orientated to be located on the lattice lines 22 of the triangular lattice.

Laying out the protrusions 13 densely not only further increases the light extraction efficiency, but it also increases the difference in length between the portions where division is easy (mainly the portions that pass through the valleys 14) in the first dividing lines 31 and the second dividing lines 32. It is preferable that the protrusions 13 are laid out densely such that the portions where division is easy (mainly the portions that pass through the valleys 14) and the portions where division is not easy (mainly the portions that pass through the protrusions 13) repeat periodically in both the first dividing lines 31 and the second dividing lines 32. The minimum distance between the protrusions 13 (the narrowest width of the valleys) is, for example, about 50 μm or less, such as about 0.5 to 50 μm, or about 1 to 20 μm. From another standpoint, one line of the lattice lines 22 that intersect the second dividing lines 32 at the minimum intersection angle θ2 and another lines of the lattice lines 22 that are parallel and adjacent to the one line are preferably disposed at a spacing that is narrower than the width of the streets 17 through which the second dividing lines 32 pass. With this layout, it is more likely that the portions where division is not easy will repeat periodically in the second dividing lines 32. It is even more preferable that the spacing between the lattice lines 22 is not more than one-fourth the street width. Similarly, with the lattice lines 22 that intersect the first dividing lines 31 at the minimum intersection angle θ1, the spacing is preferably less than the width of the streets 17 through which the first dividing lines 31 pass, and not more than one-fourth the street width is even more preferable.

The minimum intersection angle θ2 between the lattice lines 22 and the second dividing lines 32 can be less than 15°, and is preferably not more than 10°. When deviation during manufacture is taken into account, it is preferably at least 1°, and is set to within a range of 3 to 10°, for example. The minimum intersection angle θ1 between the lattice lines 22 and the first dividing lines 31 is at least greater than the minimum intersection angle θ2, the difference thereof being, for example, at least 1°, and preferably at least 5°.

An example of the size of the bottom plane of the protrusions 13 is about 0.1 to 5 μm as the maximum distance between any two apexes, or the distance between lines connecting adjacent apexes. Examples of the shape of the protrusions 13 include conical, pyramidal, prism, truncated conical, and truncated pyramidal. In the case where the shape is conical or truncated conical, the angle formed by the bottom face and the side faces of the protrusions 13 is about 30 to 80°, and preferably about 40 to 70°. When the side faces of the protrusions 13 are inclined somewhat, the thickness of the substrate 11 at the ends of the protrusions 13 will be less than when the side faces are perpendicular, so it is believed that there will tend to be less undulation of the dividing lines in the case where the first dividing lines 31 or the second dividing lines 32 pass through the ends of the protrusions 13. Instead of using the angle formed by the bottom face and the side faces of the protrusions 13, the angle formed by the valleys 14 and the side faces of the protrusions 13 can be used, in which case the angle obtained by subtracting the above-mentioned angle from 180° is used. Also, at least one of the pyramidal, prism, truncated pyramidal, or truncated conical faces can be curved face.

For example, the protrusions 13 shown in FIG. 3 have a truncated conical shape in which the side faces are made up of curved faces, and both the lower bottom and the upper bottom are semi-triangular in shape, with the upper bottom having a larger radius of curvature and being closer to circular than the lower bottom.

The height of the protrusions 13 is at least about 0.2 μm, for example, and is favorably not more than the total thickness of the semiconductor structure 12 provided on the substrate 11. If we let λ be the light emission wavelength of the light emitting elements 50, then the height of the wavelength is preferably at least λ/4. In such a case, light can be adequately scattered or refracted, and the flow of current in the lateral direction of the semiconductor structure 12 can be maintained well, ensuring good light emission efficiency. It is preferable for the protrusions 13 provided on the surface of the substrate 11 all to have the same shape and size because this tends to result in the valleys 14 being continuous in each of the second dividing lines 32, which tends to result in linearly division.

(Light Emitting Elements 50)

FIGS. 13 and 14 show an example of the light emitting elements 50. The light emitting element 50 here is rectangular in plan view. This rectangular shape is, for example, such that the two pairs of sides have a ratio of about 1:1.5 to 1:8, with about 1:2 to 1:5 being preferable, and about 1:2.5 to 1:4 being even better. More specifically, an example is a size of about 150 to 250 μm×600 to 900 μm.

It is to be understood that although the present invention has been described with regard to preferred embodiments thereof, various other embodiments and variants can occur to those skilled in the art, which are within the scope and spirit of the invention, and such other embodiments and variants are intended to be covered by the following claims.

What is claimed is:

1. A method for manufacturing a light emitting element, the method comprising:
    preparing a wafer including a substrate and a semiconductor structure,
    the substrate including a main face and a plurality of protrusions, the protrusions disposed at positions corresponding to lattice points of a regular triangular lattice, the regular triangular lattice including a plurality of lattice lines,
    the semiconductor structure provided on the main face of the substrate,
    the wafer including a plurality of light emitting parts each having a rectangular shape having shorter sides and longer sides longer than the shorter sides, a plurality of first streets extending along the shorter sides, and a plurality of second streets extending along the longer sides, each of the first streets having a first width and each of the second streets having a second width narrower than the first width;
    forming a plurality of first modified parts in the substrate,
    the forming of the first modified parts including irradiating the substrate with a laser beam along a plurality of first dividing lines passing through the first streets, the first dividing lines disposed parallel, separated at a first spacing from each other, and intersecting with the lattice lines of the regular triangular lattice at a first acute angle,
    the first acute angle being the smallest angle formed by the lattice lines and the first dividing lines;
    forming a plurality of second modified parts in the substrate before the first modified parts are formed,
    the forming of the second modified parts including irradiating the substrate with a laser beam along a plurality of second dividing lines passing through the second streets, the second dividing lines disposed perpendicular to the first dividing lines, parallel to each other, at a second spacing that is less than the first spacing, and intersecting with the lattice lines of the regular triangular lattice at a second acute angle,
    the second acute angle being the smallest of the angles formed by the lattice lines and the second dividing lines, the second acute angle being more acute than the first acute angle, and the second acute angle being less than 10°; and
    dividing the wafer along the first modified parts and the second modified parts to obtain a plurality of light emitting elements.

2. The method according to claim 1, wherein:
the lattice lines of the regular triangular lattice are lines that connect adjacent lattice points to define sides of the regular triangular lattice.

3. The method according to claim 1, wherein:
a minimum distance between the protrusions is 50 μm or less.

4. The method according to claim 1, wherein:
when viewed in a plan view, the shape of each protrusion is polygonal or a semi-polygonal shape in which the sides of the polygons are replaced by curved lines.

5. The method according to claim 1, wherein:
the protrusions are linked by a plurality of valleys, each valley including a flat face.

6. The method according to claim 1, wherein:
each laser beam has a pulse width of at least 100 femtoseconds and not more than 500 nanoseconds.

7. The method according to claim 1, wherein:
the substrate further includes a second main face, the second main face disposed on an opposite side from the main face, and
each laser beam is directed to the second main face.

8. The method according to claim 1, wherein
the semiconductor structure is a nitride semiconductor, and the material of the substrate is one with a hexagonal crystal structure.

9. The method according to claim 8, wherein the material of the substrate is sapphire.

10. The method according to claim 1, wherein the second acute angle is at least 1°.

11. The method according to claim 1, wherein each of the first width and the second width is between 10 μm and 50 μm.

12. The method according to claim 1, wherein the lattice lines intersecting with the first dividing lines at the first acute angle are separated from each other at a third spacing that is less than the first width of the first streets.

13. The method according to claim 12, wherein the third spacing is not more than one-fourth of the first width.

14. The method according to claim 1, wherein the lattice lines intersecting with the second dividing lines at the second acute angle are separated from each other at a fourth spacing that is less than the second width of the second streets.

15. The method according to claim 14, wherein the fourth spacing is not more than one-fourth of the second width.

\* \* \* \* \*